(12) United States Patent
Kao

(10) Patent No.: US 7,516,119 B1
(45) Date of Patent: Apr. 7, 2009

(54) METHOD AND APPARATUS FOR ACTION GROUP GENERATION AND ARBITRATION IN A CLASSIFICATION ENGINE

(75) Inventor: Sophia W. Kao, Cupertino, CA (US)

(73) Assignee: RMI Corporation, Cupertino, CA (US)

( * ) Notice: Subject to any disclaimer, the term of this patent is extended or adjusted under 35 U.S.C. 154(b) by 41 days.

(21) Appl. No.: 10/789,791

(22) Filed: Feb. 27, 2004

Related U.S. Application Data

(63) Continuation-in-part of application No. 10/735,107, filed on Dec. 12, 2003, now Pat. No. 7,234,019.

(51) Int. Cl.
*G06F 7/00* (2006.01)
*G06F 17/30* (2006.01)
*G06F 12/00* (2006.01)
*G06F 13/00* (2006.01)
*G06F 13/28* (2006.01)
*G06F 12/08* (2006.01)
*H04L 12/28* (2006.01)

(52) U.S. Cl. .............................. 707/3; 707/6; 709/245; 711/108; 370/395.32

(58) Field of Classification Search .................... 707/3, 707/6; 711/136, 108; 709/245; 370/395.32
See application file for complete search history.

(56) References Cited

U.S. PATENT DOCUMENTS

| | | | | |
|---|---|---|---|---|
| 5,875,446 | A * | 2/1999 | Brown et al. .................... | 707/3 |
| 6,223,172 | B1 * | 4/2001 | Hunter et al. .................. | 707/3 |
| 6,226,710 | B1 * | 5/2001 | Melchior ..................... | 711/108 |
| 6,307,855 | B1 * | 10/2001 | Hariguchi .................... | 370/392 |
| 6,717,946 | B1 * | 4/2004 | Hariguchi et al. ........... | 370/392 |
| 7,002,965 | B1 * | 2/2006 | Cheriton ................ | 370/395.32 |

* cited by examiner

*Primary Examiner*—Don Wong
*Assistant Examiner*—Helene Rose
(74) *Attorney, Agent, or Firm*—Zilka-Kotab, PC

(57) ABSTRACT

An action group arbitration system can include an action table and a search block having a first type memory portion and a second type memory portion is disclosed. The search block can provide a plurality of search results, each corresponding to a group number, in response to a search key. The action table may receive the search results and provide an action indication in response to each of the plurality of search results that contain a hit indication. The first type memory portion can include static random access memory (SRAM) and the second type memory portion can include ternary content addressable memory (TCAM). Further, the action table may be divided into portions corresponding to the group number.

10 Claims, 5 Drawing Sheets

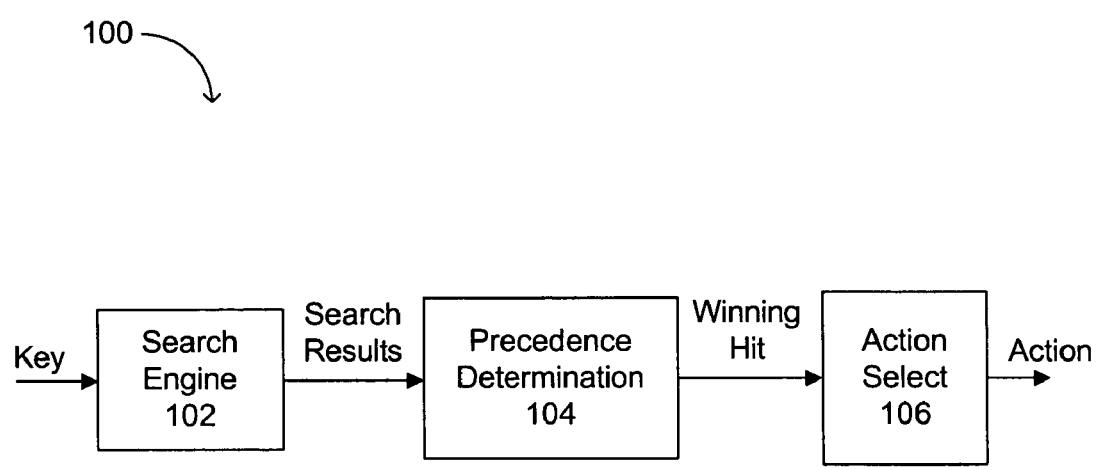
FIG. 1 (conventional)

METHOD AND APPARATUS FOR ACTION GROUP GENERATION AND ARBITRATION IN A CLASSIFICATION ENGINE

RELATED APPLICATIONS

This application is a continuation in part of U.S. Ser. No. 10/735,107, filed Dec. 12, 2003, U.S. Pat. No. 7,234,019 issued Jun. 19, 2007, incorporated herein by reference.

FIELD

The invention relates generally to the field of classification engines and, more particularly, to a method and apparatus for action group generation and arbitration in a classification engine.

BACKGROUND

In networking systems, classification engines can be used to determine an action to perform and/or a rule to apply to a particular packet. Such classification can include the use of a lookup function, which can be implemented as a hardware "search engine" or the like. Such search engines can include content addressable memory (CAM) and/or a standard memory, such as static random access memory (SRAM). The standard memory is commonly accessed using "hashing" to essentially provide a "many-to-one" function. Such an approach can allow for a smaller memory size so that overall system costs can be reduced. Further, types of CAM include "ternary" CAM, which can allow for matching one of three possible storage states: 0, 1, or "x" (i.e., a "don't care" term).

A search key applied to a search engine can result in several "hit" or "miss" indications. If the search key is found (i.e., a "match" occurs) at multiple locations within the memory system, a priority or "precedence" determination must be employed in order to provide an overall winner. Further, the overall winner in a system or a subsystem may be used to determine an action to be performed on a packet. Referring now to FIG. 1, a block diagram of a conventional action selection system is shown and indicated by the general reference character 100. The search key "Key" can be applied to Search Engine 102, which provides Search Results, including hit or miss indications, to Precedence Determination 104. Of course, this precedence determination may be integrated with the search engine. In any event, the precedence determination can choose a highest priority hit indication (e.g., Winning Hit) from among multiple hit indications. The winning hit can be provided to Action Select 106, which can provide an "Action" to be performed on a packet.

A limitation of this conventional approach is its scalability: as the number of types of actions is increased, the approach becomes less viable. Also, even though some action types are orthogonal (i.e., unrelated in nature) to each other, they are all included in the same action set in this approach and, as a result, the overall system is not efficient for a large number of possible actions. Consequently, what is needed is an action group generation and arbitration approach that allows flexibility in selecting appropriate actions to perform on a packet based on hit results from different matched rules or search patterns.

SUMMARY

The invention overcomes the identified limitations and provides action group selection suitable for classification engines in support of multiple advantageous features.

According to embodiments of the invention, an action group arbitration system can include an action table and a search block having a first type memory portion and a second type memory portion. The search block can provide a plurality of search results, each corresponding to a group number, in response to a search key. The action table may receive the search results and provide an action indication in response to each of the plurality of search results that contain a hit indication. The first type memory portion can include static random access memory (SRAM) and the second type memory portion can include ternary content addressable memory (TCAM). Further, the action table may be divided into portions corresponding to the group number.

According to another aspect of embodiments of the invention, a method of arbitrating actions can include the steps of: (i) performing a search operation; (ii) accessing a stored action group number corresponding to each hit resulting from the search; (iii) checking if the group subfields in the action group number are enabled for any hits from the search; (iv) if the group is enabled, allowing the hit; (v) if the group is not enabled, suppressing the hit; (vi) determining a precedence to provide a search result for the group; and (vii) selecting an action from an action table portion corresponding to the group.

Advantages of the invention include flexibility in selecting appropriate actions to perform on a packet from a relatively large group of possible actions.

BRIEF DESCRIPTION OF THE FIGURES

Embodiments of the invention are described with reference to the FIGS, in which:

FIG. 1 is a block diagram of a conventional action selection system;

DETAILED DESCRIPTION

Embodiments of the invention are described with reference to specific diagrams depicting system arrangements and methods. Those skilled in the art will recognize that the description is for illustration and to provide the best mode of practicing the invention. The description is not meant to be limiting. For example, reference is made to specific memory types, such as static random access memory (SRAM) and ternary content addressable memory (TCAM), but the invention is applicable to other types of memory and/or search solutions as well. Also, memory bank entries and/or arrangements thereof in a system merely provide example implementations and should not be construed as limiting. Further, while a specific number of memory banks and action groups in a system are shown, those skilled in the art will recognize that the invention is applicable to other numbers of memory banks and/or action groups as well.

Figure 2:
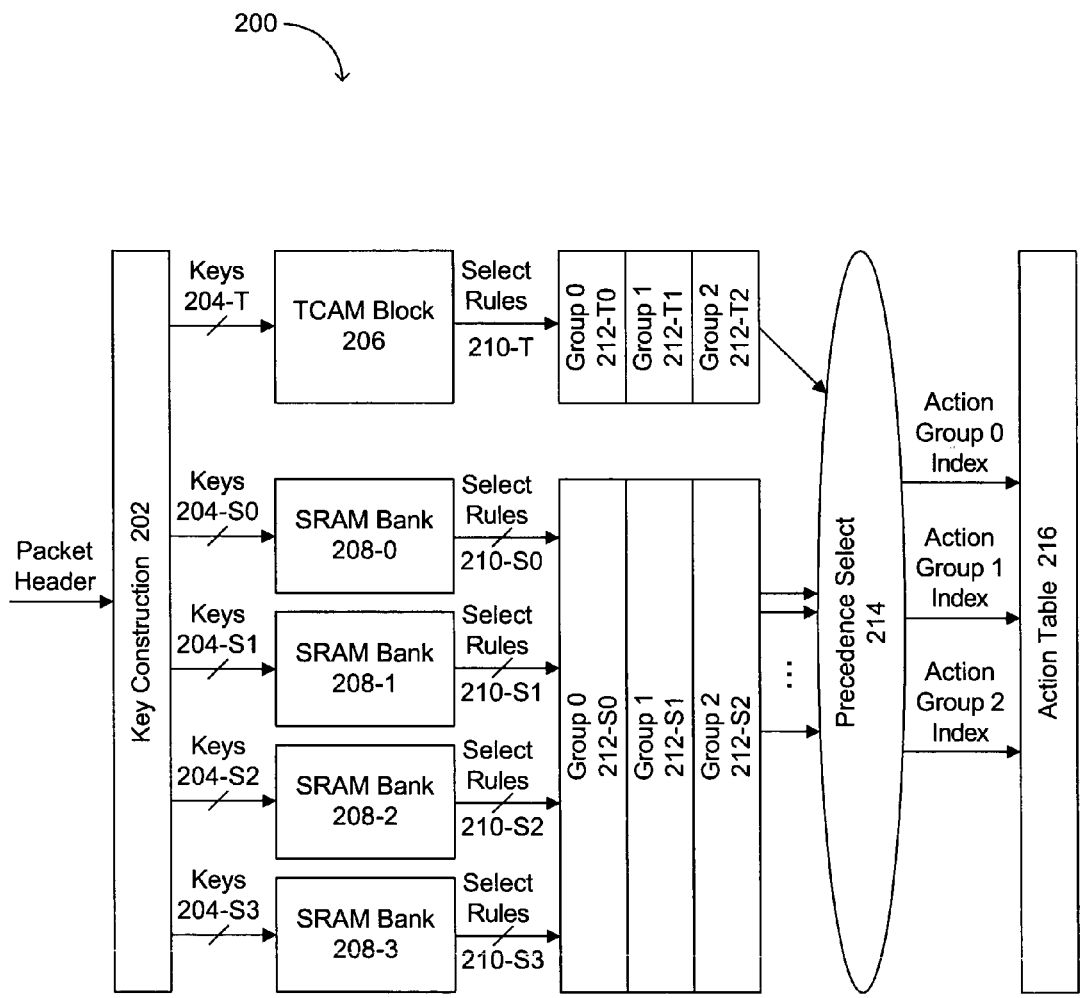
FIG. 2 is a block diagram of a classification engine according to an embodiment of the invention.

Referring now to FIG. 2, a block diagram of a classification engine according to an embodiment of the invention is shown and indicated by the general reference character 200. A Packet Header can be received by block Key Construction 202. Accordingly, the constructed keys can include information taken from a packet header. For example, if an incoming packet header is up to 140B long, 16 constructed keys of 256-bits each may be parsed from the packet header. The searching of these 16 constructed keys can then be done essentially in parallel fashion. Examples of types of packet headers that can be used for key construction include Internet Protocol (IP) and Media Access Control (MAC) type addresses. Further, other sources for constructed keys can include, for example, fields extracted from a packet parser, programmable offset values extracted from packet headers, predefined address fields, and/or packet profiles. Here, embodiments may provide a classification engine function whereby a packet header can be matched with a particular rule.

In FIG. 2, Key Construction 202 can provide Keys 204-T to TCAM Block 206, Keys 204-S0 to SRAM Bank 208-0, Keys 204-S1 to SRAM Bank 208-1, Keys 204-S2 to SRAM Bank 208-2, and Keys 204-S3 to SRAM Bank 208-3. Of course, the four SRAM bank and one TCAM block arrangement shown in FIG. 2 represents only one example implementation. Any number of SRAM banks and/or TCAM blocks or banks could be used in accordance with embodiments of the invention. In FIG. 2, a search result from TCAM Block 206 can include Select Rules 210-T provided to Group 0 212-T0, Group 1 212-T1, or Group 2 212-T2, depending on the group designation of the search, for example. Search results from the SRAM banks can include Select Rules 210-S0 from SRAM Bank 208-0, Select Rules 210-S1 from SRAM Bank 208-1, Select Rules 210-S2 from SRAM Bank 208-2, and Select Rules 210-S3 from SRAM Bank 208-3, for example. Each of these search results from the SRAM banks can be provided to Group 0 212-S0, Group 1 212-S1, or Group 2 212-S2, depending on the group designation of the search, for example. For each of the groups, search results including the appropriate precedence levels, can be provided to Precedence Select 214, which can determine a "winner" or overall priority hit search result for each group. Action Table 216 can receive the winning index for groups 0, 1, and 2: Action Group 0 Index, Action Group 1 Index, and Action Group 2 Index, respectively.

Figure 3:
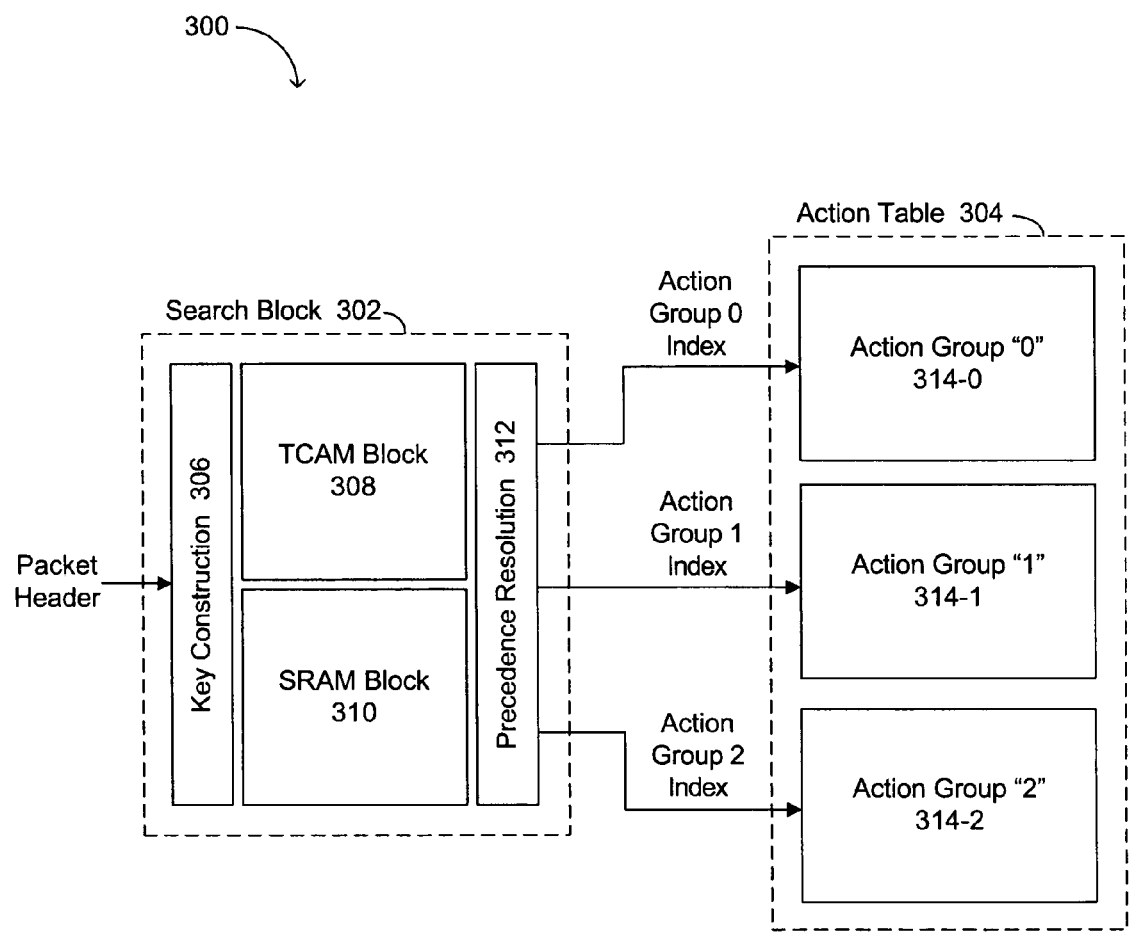
FIG. 3 is a block diagram of an action group system according to an embodiment of the invention.

Referring now to FIG. 3, a block diagram of an action group system according to an embodiment of the invention is shown and indicated by the general reference character 300. Search Block 302 can receive Packet Header and provide Action Group 0 Index, Action Group 1 Index, and Action Group 2 index, for example. In the particular example of FIG. 3, three action groups are used; however, one skilled in the art will recognize that more or less action groups could be used consistent with embodiments of the invention. Search Block 302 can include portions Key Construction 306, TCAM Block 308, SRAM Block 310, and Precedence Resolution 312. Action Table 304 can include portions Action Group "0" 314-0, Action Group "1" 314-1, and Action Group "2" 314-2, for example. In one embodiment, three search operations can effectively be done in parallel by first performing the search on all search entries and then qualifying any "hit" results by group enable designations to generate selection signals, as will be discussed in more detail below. Accordingly, a search for action group "0," a search for action group "1," and a search for action group "2" may effectively proceed in parallel. In this fashion, the overall search operation results can be designated for each of the particular action groups.

In determining the actions that are allocated to an action group, a user can program a field of 8-bits, for example, to assign one or more categories of actions to a particular group. Each action group may have its own user programmable 8-bit register that may enable categories of actions to belong to that particular group and each category in an action table can be assigned to only one of the action groups. For example, a category number of "0" may include actions, such as drop (i.e., drop the packet) and flow sampling, while a category number "2" may include actions, such as increment a packet counter. Other example actions that may be used in accordance with embodiments of the invention include mirroring, assigning class of service (CoS), port of exit (POE) blocking, and changing outgoing headers, as just a few examples.

Figure 4:
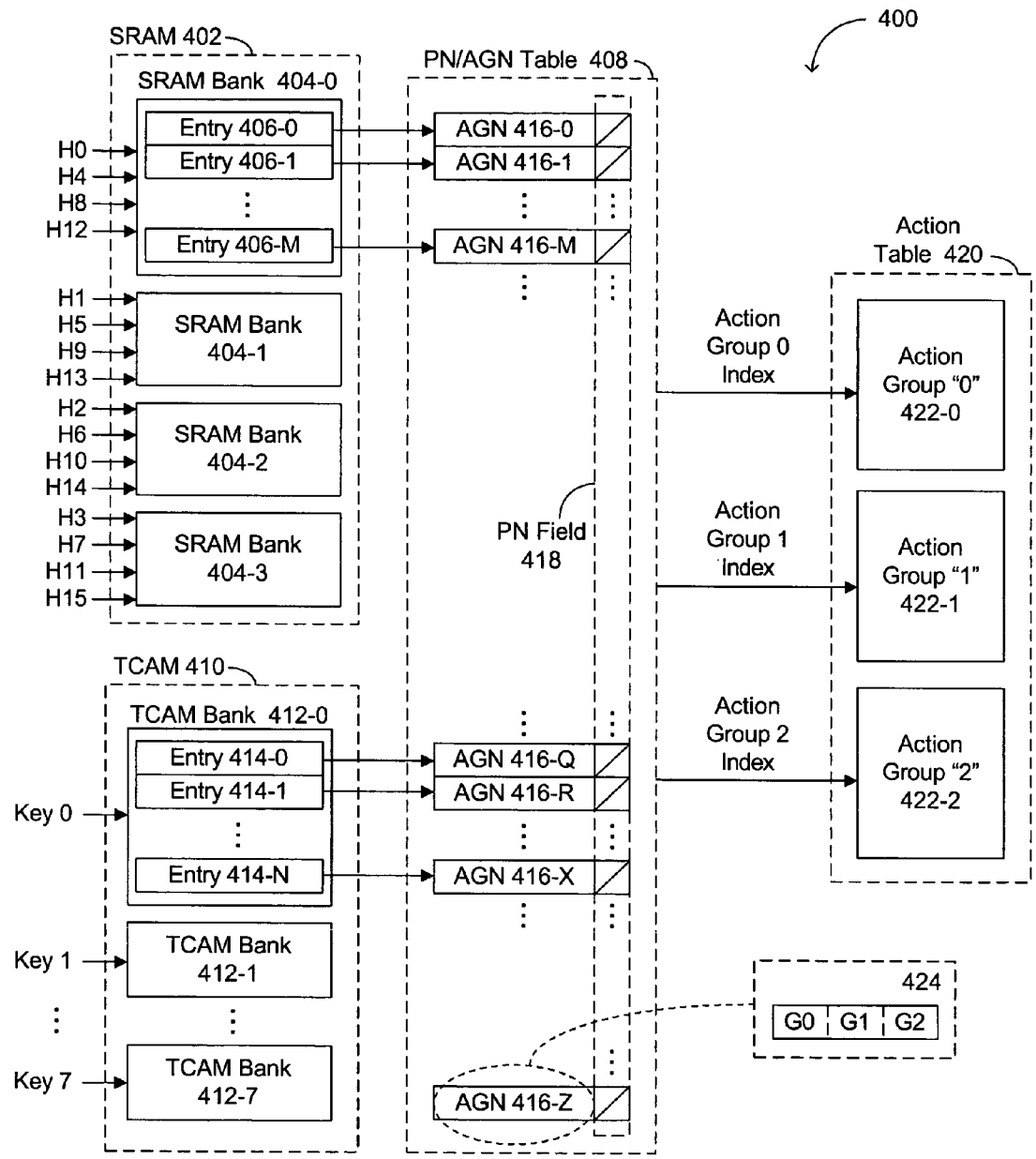
FIG. 4 is a block diagram of an action group table arrangement in an action group system according to an embodiment of the invention.

Referring now to FIG. 4, a block diagram of an action group table arrangement in an action group system according to an embodiment of the invention is shown and indicated by the general reference character 400. In this very particular example, SRAM 402 can include four banks: SRAM Bank 404-0, 404-1, 404-2, and SRAM Bank 404-3. Of course, more or less banks could be used in accordance with embodiments of the invention. Each of the SRAM banks can receive four hash signals, where each such signal can be generated by a Cyclic Redundancy Code (CRC) type function, for example. In this particular example arrangement, SRAM Bank 404-0 can receive hash signals H0, H4, H8, and H12, SRAM Bank 404-1 can receive hash signals H1, H5, H9, and H13, SRAM Bank 404-2 can receive hash signals H2, H6, H10, and H14, and SRAM Bank 404-3 can receive hash signals H3, H7, H11, and H15. In this fashion, four hash functions or rules can be available for each SRAM memory bank.

Each SRAM bank can be arranged as "entries," such as those shown for SRAM Bank 404-0: Entry 406-0, Entry 406-1, . . . . Entry 406-M. Further, each entry can correspond to a location in Precedence Number/Action Group Number (PN/AGN) Table 408, which contains stored action group numbers (AGNs) or entries of one or more stored values. As one example, the AGNs may be programmed by software control. Accordingly, a user may place an AGN associated with each entry or rule into the PN/AGN table at the appropriate address. In this example, SRAM Entry 406-0 can correspond to AGN 416-0, Entry 406-1 can correspond to AGN 416-1, and so on through Entry 406-M corresponding to AGN 416-M. In this fashion, each of the SRAM entries is configured to select one or more of the stored action group numbers (AGNs).

The system can also include portion TCAM 410, as shown in FIG. 4. In this very particular example, TCAM 410 can include eight banks: TCAM Bank 412-0, 412-1, . . . through TCAM Bank 412-7. Of course, more or less banks could be used in accordance with embodiments of the invention. Each of the TCAM banks can receive a search key: Key 0, Key 1, . . . through Key 7. As one example, such search keys may be generated by a key construction block, as discussed above with reference to FIG. 2. In FIG. 4, each TCAM bank can be arranged in TCAM entries, such as those shown for TCAM Bank 412-0: Entry 414-0, Entry 414-1, . . . . Entry 414-N. Further, similar to the SRAM entries, each TCAM entry can also correspond to an action group number (AGN) in PN/AGN Table 408. In this example, TCAM Entry 414-0 can correspond to AGN 416-Q, Entry 414-1 can correspond to AGN 416-R, and so on through Entry 414-N corresponding to AGN 416-X. In this fashion, each of the TCAM entries is configured to select one or more of the stored AGNs. In an alternative embodiment, however, a stored AGN may be allocated to an entire TCAM bank instead of per TCAM entry. In such an alternative embodiment, the size of the PN/AGN table may be reduced.

In the particular example shown in FIG. 4, each entry of portions SRAM 402 and TCAM 410 can select one of AGN 416-0 through AGN 416-Z. Dashed block 424 shows an example structure of an AGN field, such as AGN 416-Z. The field can include 3 stored enable values or subfields: G0, G1, and G2, where each subfield can correspond to a particular action group. These subfields can be implemented as "enable" bits so that, for example, a "1" state may indicate that the group is enabled and a "0" state may indicate that the group is disabled. Accordingly, an AGN=010 may indicate that group 1 (G1) is enabled, but group 0 (G0) and group 2 (G2) are disabled for a particular search table entry. In addition to the access group number field of each entry in the PN/AGN Table 408, a priority number (PN) field is also included. This field can be used to determine a winning hit from a group of hits, as discussed above with reference to the precedence select mechanism of FIG. 2. Accordingly, for multiple hits that have action group 1 enabled, such as in the above example, associated PN fields can be used to determine and select the final winner at the address or "index" of that winning entry for each group.

Also in FIG. 4, Action Table 420 is shown to include portions Action Group "0" 422-0, Action Group "1" 422-1, and Action Group "2" 422-2. Of course, this is only a particular example and one skilled in the art will recognize that more or less action groups could be used consistent with embodiments of the invention. In FIG. 4, each action group can correspond to one of the search result selection signals: Action Group 0 Index, Action Group 1 Index, and Action Group 2 Index. Accordingly, for search 0 enabled groups, a priority or "winning" hit having an associated enabled AGN value may provide Action Group 0 Index to select an action from Action Group "0" 422-0. For example, such "search 0 enabled groups" may include all entries in SRAM 402 and/or TCAM 410 that have a corresponding AGN=1xx, where "x" is a don't care term. Similarly, for search 1 enabled groups (e.g., AGN=x1x), a winning hit having an associated enabled AGN value may provide Action Group 1 Index to select an action from Action Group "1" 422-1. And, for search 2 enabled groups (e.g., AGN=xx1), a winning hit having an associated enabled AGN value may provide Action Group 2 Index to select an action from Action Group "2" 422-2.

Figure 5:
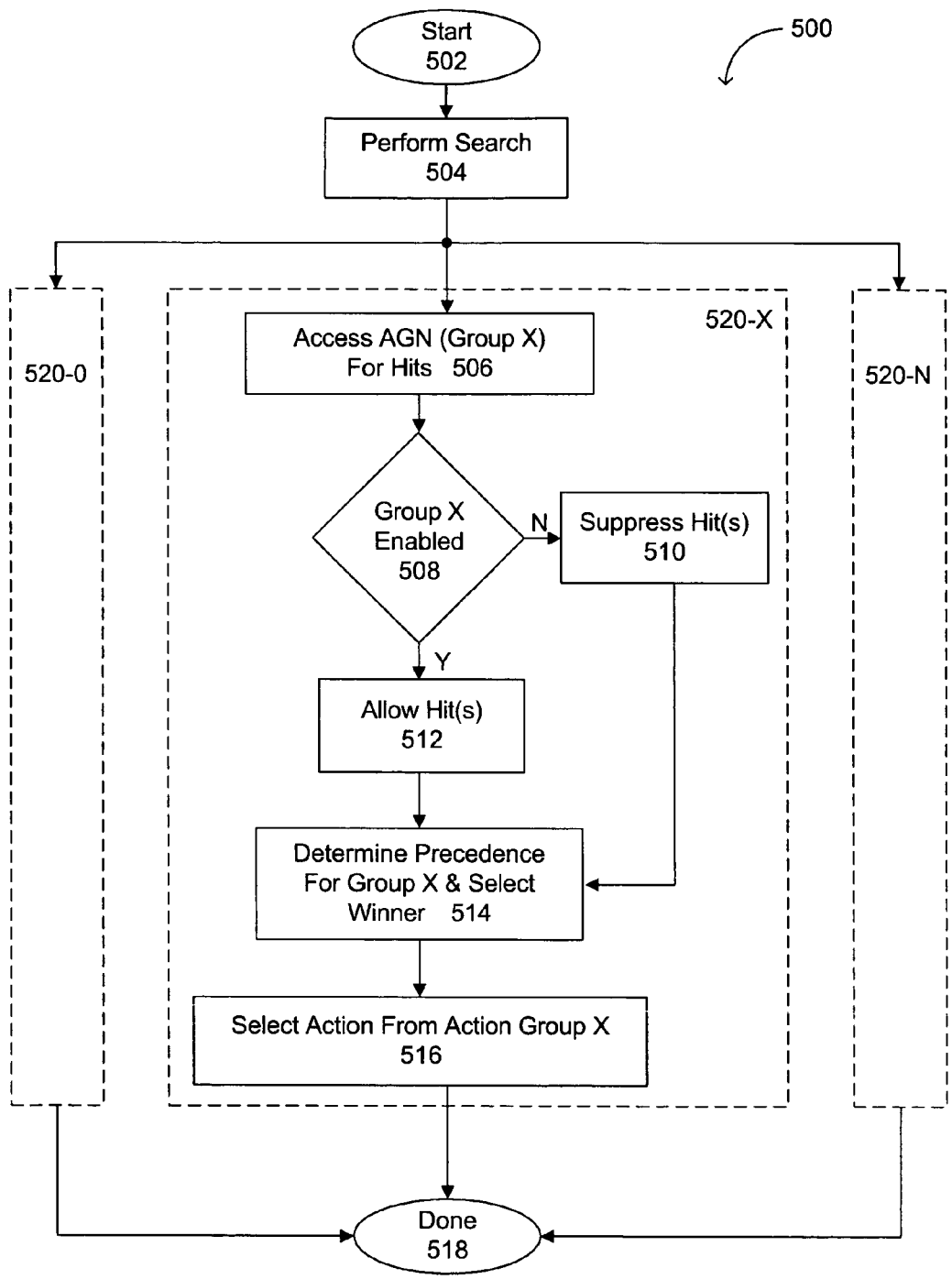
FIG. 5 is a flow diagram of a method of arbitrating actions according to embodiments of the invention.

Referring now to FIG. 5, a flow diagram of a method of arbitrating actions according to embodiments of the invention is shown and indicated by the general reference character 500. The flow can begin in Start 502. Next, the flow can proceed to step Perform Search 504, which can include initiating a search operation. In this example, block 520-0 represents a search result qualification corresponding to group "0," block 520-X represents a search result qualification corresponding to group "X," and block 520-N represents a search result qualification corresponding to group "N." Each of these search result qualifications can proceed in a parallel fashion and each can include the steps as generally shown within box 520-X. Within box 520-X, the flow can proceed to step Access AGN (Group X) For Hits 506. In this step, an associated stored AGN can be accessed for each entry corresponding to a hit. Next, decision box Group X Enabled 508 can check the appropriate subfields of the AGN to see if that entry is enabled for Group X. For a given "hit" indication, if Group X is not enabled, then that hit can be suppressed in step Suppress Hit(s) 510. However, if Group X is enabled, the hit can be allowed in step Allow Hit(s) 512. From either step 510 or step 512, the flow can proceed to step Determine Precedence For Group X & Select Winner 514 to determine a priority hit from among the remaining allowed hits. Next, the flow can proceed to step Select Action From Action Group X 516. In this step, an action found in a portion of an action group table corresponding to the group number can be accessed. For each of 520-0, 520-X, and 520-N, the flow can end in Done 518.

Advantages of the invention include flexibility in selecting appropriate actions to perform on a packet from a large group of possible actions.

Having disclosed exemplary embodiments and the best mode, modifications and variations may be made to the disclosed embodiments while remaining within the subject and spirit of the invention as defined by the following claims.

The invention claimed is:

1. An action group arbitration system, comprising:
a searchable memory block having a first type memory portion and a second type memory portion;
wherein the first type memory portion includes static random access memory (SRAM);
wherein the second type memory portion includes ternary content addressable memory (TCAM);
wherein the first and second type memory portions include a plurality of entries;
the plurality of entries configured to provide a search result in response to a search key;
a first table having a plurality of stored values for each of the plurality of entries;
wherein each of the plurality of stored values is an action group that corresponds with one of the plurality of entries, the first table configured to receive the search result and to provide a selection signal in response to the search result, the selection signal corresponding with at least one of the plurality of entries, wherein each of the plurality of entries includes a first state that includes a hit or match indication and an associated stored value having an enable state; and
a second table configured to receive the selection signal and to provide an action indication in response to the selection signal;
wherein the second table includes an action table having a plurality of portions;
wherein each of the plurality of portions is configured to be accessed by a corresponding one of a plurality of the selection signals;
wherein each of the plurality of portions corresponds to an action group;
and wherein the first type memory portion and the second type memory portion operate in parallel to provide search results.

2. The action group arbitration system of claim 1, wherein: the action group includes a user programmable register for enabling one or more categories of actions.

3. The action group arbitration system of claim 1, wherein: the selection signal is generated in response to a precedence determination.

4. The action group arbitration system of claim 1, wherein: the action indication includes an action to be performed on a packet.

5. A method of arbitrating actions, comprising the steps of:
performing a search operation on a searchable memory block;
wherein the performing the search operation includes searching a memory block having a first type memory portion and a second type memory portion;
wherein the first type memory portion includes static random access memory (SRAM);
wherein the second type memory portion includes ternary content addressable memory (TCAM);
accessing a stored action group number in a first table, the stored action group number corresponding to each hit resulting from the search operation, the stored action group number including a group subfield and a precedence number;

selecting an entry from an action group number table;

checking if the group subfields in the stored action group number are enabled for any hits from the search operation;

allowing the hit for a group if the group subfield is enabled;

suppressing the hit for the group if the group subfield is not enabled;

determining a precedence based on the precedence number to provide a search result for the group;

wherein the determining the precedence includes selecting a highest priority hit from among a remaining group of hits; and selecting an action based on the search result from an action table portion corresponding to the group;

wherein the action table includes a portion corresponding to each of the groups; and wherein the selecting the action from the action table includes accessing the portion corresponding to the group; and wherein the first type memory portion and the second type memory portion operate in parallel to provide search results.

6. An action group arbitration system, comprising:

a searchable memory block having a first type memory portion and a second type memory portion;

wherein the first type memory portion includes static random access memory (SRAM);

wherein the second type memory portion includes ternary content addressable memory (TCAM);

wherein the first and second type memory portions include a plurality of entries;

the plurality of entries configured to provide a search result in response to a search key;

a first table having a plurality of stored values for each of the plurality of entries;

wherein each of the plurality of stored values is an action group that corresponds with one of the plurality of entries, the first table configured to receive the search result and to provide a selection signal in response to the search result, the selection signal corresponding with at least one of the plurality of entries, wherein each of the plurality of entries includes a first state that includes a hit or match indication and an associated stored value having an enable state; and a second table configured to receive the selection signal and to provide an action indication in response to the selection signal;

wherein the second table includes an action table having a plurality of portions;

wherein each of the plurality of portions is configured to be accessed by a corresponding one of a plurality of the selection signals;

wherein each of the plurality of portions corresponds to an action group; and wherein the action group includes a user programmable register for enabling one or more categories of actions.

7. The action group arbitration system of claim 6, wherein:
the selection signal is generated in response to a precedence determination.

8. The action group arbitration system of claim 6, wherein:
the action indication includes an action to be performed on a packet.

9. The action group arbitration system of claim 6, wherein:
the first type memory portion and the second type memory portion operate in parallel to provide search results.

10. The method of claim 5, wherein:
the action includes an action to be performed on a packet.

* * * * *